US012648229B2

(12) United States Patent
Baylav et al.

(10) Patent No.: US 12,648,229 B2
(45) Date of Patent: Jun. 2, 2026

(54) TRANSITION CELLS BETWEEN DESIGN BLOCKS ON A WAFER

(71) Applicant: Intel Corporation, Santa Clara, CA (US)

(72) Inventors: Burak Baylav, Hillsboro, OR (US); Nidhi Khandelwal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 367 days.

(21) Appl. No.: 17/561,723

(22) Filed: Dec. 24, 2021

(65) Prior Publication Data

US 2023/0207552 A1      Jun. 29, 2023

(51) Int. Cl.
H10D 89/10       (2025.01)
G06F 30/392       (2020.01)

(52) U.S. Cl.
CPC ........... H10D 89/10 (2025.01); G06F 30/392 (2020.01)

(58) Field of Classification Search
CPC ..... H10D 89/10; G06F 30/392; H01L 23/522; H01L 23/528; H01L 23/488; H01L 21/50; H01L 23/52; H10W 20/43; H10W 20/40; H10W 95/00; H10W 72/20; H10W 72/00
See application file for complete search history.

(56) References Cited

U.S. PATENT DOCUMENTS

| | | | |
|---|---|---|---|
| 6,950,369 B2 * | 9/2005 | Kunikiyo | G11C 11/1675 365/158 |
| 2005/0044520 A1 | 2/2005 | Vuong | |
| 2006/0081988 A1 | 4/2006 | Dunham | |
| 2022/0310768 A1 * | 9/2022 | Long | H10K 59/1315 |

FOREIGN PATENT DOCUMENTS

WO      WO 2001/071808      9/2001

OTHER PUBLICATIONS

Search Report from European Patent Application No. 22206001.4, mailed Jun. 6, 2023, 7 pgs.
Office Action from European Patent Application No. 22206001.4, mailed Apr. 9, 2026, 6 pgs.

* cited by examiner

*Primary Examiner* — Tan N Tran
(74) *Attorney, Agent, or Firm* — Schwabe, Williamson & Wyatt, P.C.

(57) ABSTRACT
Embodiments described herein may be related to apparatuses, processes, and techniques related to filling in whitespace between one or more groups of functional circuits on a wafer. The whitespace may be divided into a plurality of cells including periphery cells and central cells, where a portion of the cells may have the same design, where a characteristic of the plurality of cells, for example a density of metal within the cell, may be designed in order to facilitate the fabrication process of the wafer. Other embodiments may be described and/or claimed.

12 Claims, 9 Drawing Sheets

| | |
|---|---|
| | Central Cell | 240 |
| | Convex Corner Cell | 242 |
| | Concave Corner Cell | 244 |
| | Top/Bottom Outer Cells | 246 |
| | Left/Right Outer Cells | 248 |

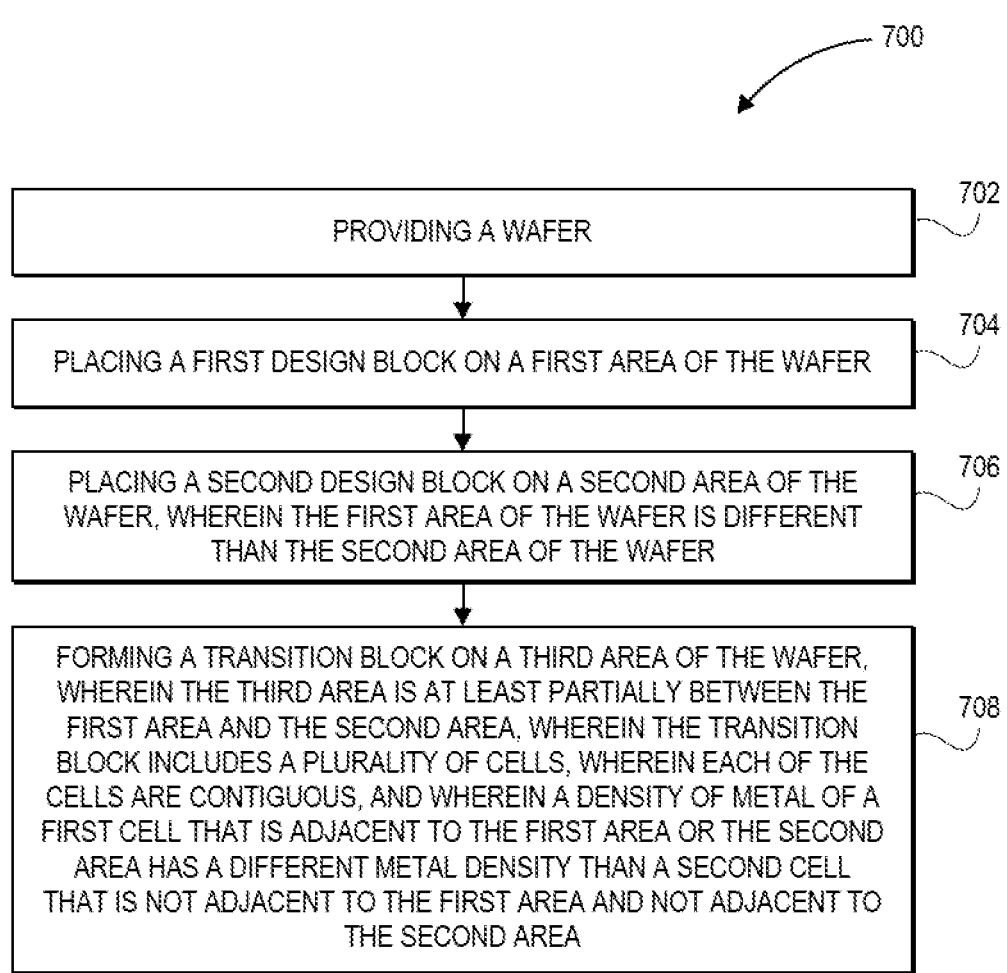

700

702
PROVIDING A WAFER

704
PLACING A FIRST DESIGN BLOCK ON A FIRST AREA OF THE WAFER

706
PLACING A SECOND DESIGN BLOCK ON A SECOND AREA OF THE WAFER, WHEREIN THE FIRST AREA OF THE WAFER IS DIFFERENT THAN THE SECOND AREA OF THE WAFER

708
FORMING A TRANSITION BLOCK ON A THIRD AREA OF THE WAFER, WHEREIN THE THIRD AREA IS AT LEAST PARTIALLY BETWEEN THE FIRST AREA AND THE SECOND AREA, WHEREIN THE TRANSITION BLOCK INCLUDES A PLURALITY OF CELLS, WHEREIN EACH OF THE CELLS ARE CONTIGUOUS, AND WHEREIN A DENSITY OF METAL OF A FIRST CELL THAT IS ADJACENT TO THE FIRST AREA OR THE SECOND AREA HAS A DIFFERENT METAL DENSITY THAN A SECOND CELL THAT IS NOT ADJACENT TO THE FIRST AREA AND NOT ADJACENT TO THE SECOND AREA

FIG. 7

TRANSITION CELLS BETWEEN DESIGN BLOCKS ON A WAFER

FIELD

Embodiments of the present disclosure generally relate to the field of semiconductor processing, and in particular to whitespace between design blocks on a die.

BACKGROUND

Continued growth in virtual machines, cloud computing, and portable devices will continue to increase the demand for high density transistors within chips and packages.

BRIEF DESCRIPTION OF THE DRAWINGS

FIG. 7 illustrates an example process for manufacturing a wafer that includes transition cells between design blocks on the wafer, in accordance with various embodiments.

DETAILED DESCRIPTION

Figure 1:
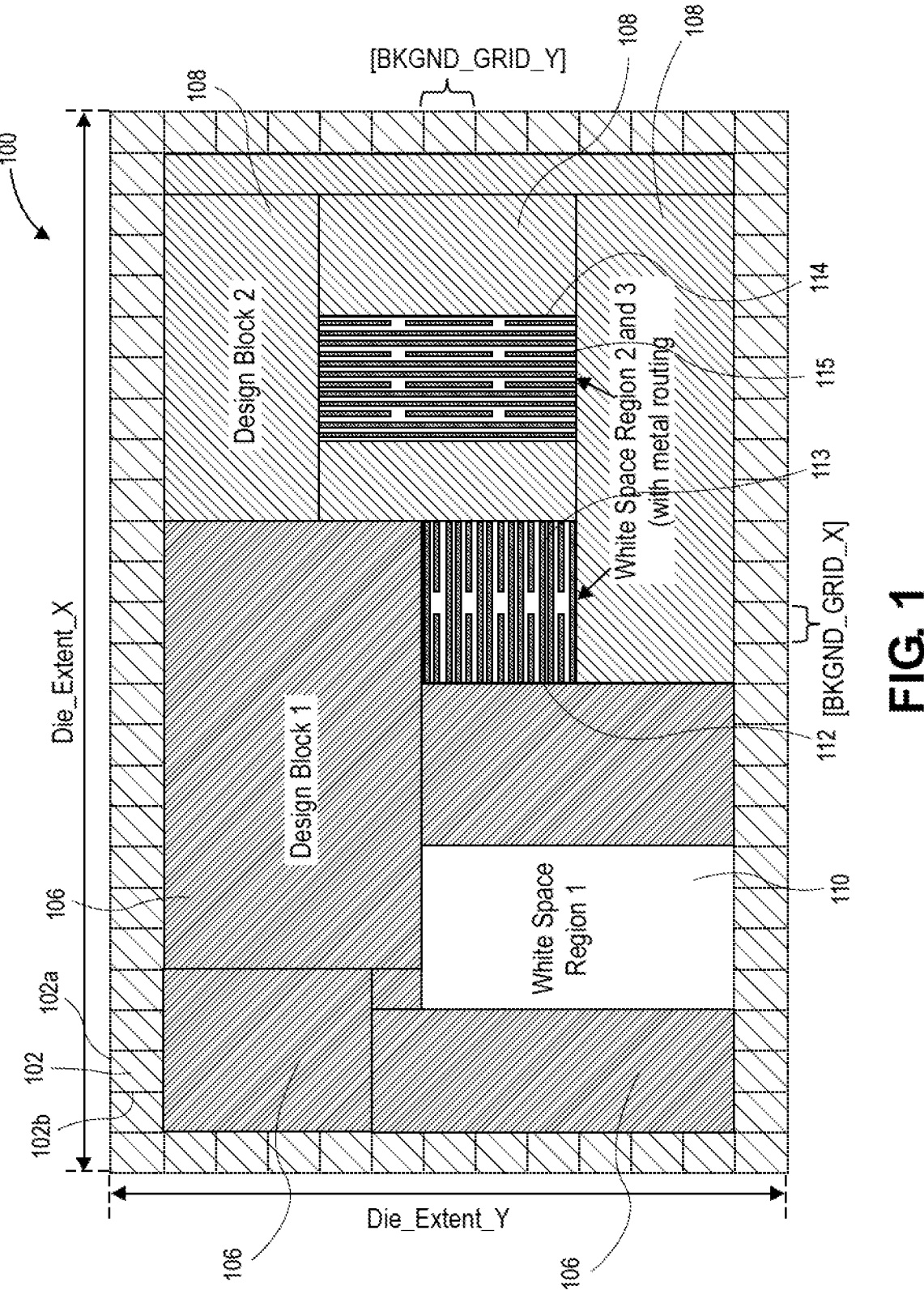
FIG. 1 illustrates a top-down view of a die that includes two design blocks with whitespace regions in between, in accordance with various embodiments.

Embodiments described herein may be related to apparatuses, processes, and techniques directed to filling in whitespace between one or more groups of design blocks on a wafer. In embodiments, the design blocks may be referred to as electrically functioning circuitries. Separate design blocks may be designed independently by the same or different design groups and subsequently stitched together to form a final die on a wafer. In embodiments, the whitespace corresponds to empty regions between the design blocks on the wafer. In embodiments, the whitespace corresponds to empty regions on a substrate of a die between design blocks that are on the substrate of the die. In embodiments, the whitespace may be divided into a plurality of predefined cells, where a characteristic of the plurality of cells, for example density of a metal layer within the cell, may be optimized, in order to facilitate the healthiest fabrication process of the wafer.

In semiconductor processing, a "die footprint" usually corresponds to a collage of several design blocks that may be designed by many design groups and stitched together to form the final die to be taped in. The floor planning of a die strives to balance ease of block integration with circuit properties such as delay and congestion. This task sometimes results in empty regions between the design blocks, often referred to as whitespace in literature. There can be cases where whitespace is truly empty, or routing over it is needed via some back-end metal layer. Although whitespace parts of a die may not provide any useful device functionality, such regions still need to be populated to meet process-related requirements such as optimal density and healthy lithographic patterning.

In some legacy implementations, designers come up with their own filler cells to be inserted in the residual spaces between design blocks. This approach is done pre tape in and can introduce significant delay for tape in schedule. Furthermore, if an update is needed on the filler cells, the turnaround time would be significant since a new tape in would be needed. In some other legacy implementations, whitespace regions may have been filled in post tape in, by a "layer by layer" approach, where inter-layer visibility through the stack is lacking. Such "per-layer fill" approaches reduce the consistency and deterministic nature of white space fill from one location to another on wafer, and if contact layers are also part of the fill stack, it may even introduce undesired electrical nets among several layers (e.g. antenna effects). In some other legacy implementations, electronic design automation (EDA) tools can be used to fill in whitespace regions on a cell-based basis. Embodiments utilize the latter capability to introduce consistent and deterministic whitespace fills when back-end metal routing conditions exist over whitespaces for a gridded die foot print area.

In embodiments, a cell may include multiple layers, including front end layers and backend layers. Front end layers may include metal features and other transistor forming features such as n-wells and p-wells. Backend layers may include features such as metal layers and contacts. In embodiments, cells within a whitespace that are adjacent to design blocks, which may be referred to as periphery cells of the whitespace, may have certain design characteristics, such as densities of metal within the cell, that may serve as optimal transition features between an edge of a design block and central cells of the whitespace. In embodiments, these central cells may all be of a similar design and may each have fixed optimum densities for each layer designed to facilitate a robust overall fabrication process of the wafer. Embodiments will provide ease-of-use capability for designers by mitigating the need to comply with complex chemical mechanical polishing related design rules and eliminate filler design insertion related delays before product tape-ins; hence, accelerate time to market for products.

In some embodiments, uppermost layers of a cell within a whitespace may overlap with drawn metal routing features that are used to electrically couple a design block with itself or with other design blocks. In these embodiments, the back-end part of the cell stacks within a whitespace may be designed to take into account these drawn electrical routings. In embodiments, full and partial stack layers of cells may be defined and used for all possible back-end routing implementations, as discussed further below.

Embodiments described herein enable hierarchical placement of whitespace fill cells and hence may improve the efficiency, scalability and compute time associated with post tape-in fill processing. In addition, discrete patterns of cell designs, each with a known density per layer, may be selected as components to use within whitespace regions to minimize whitespace design complexity. Interlayer visibility within a given fill cell allows for minimizing parasitic capacitance and antenna effects through the stack in the given filler cell. The component structure is simpler to modify and easier to keep track of the fill unit cells as compared to legacy implementations. In addition, if process related issues are discovered in whitespace region during fabrication, the process needs can be fulfilled by changing the fill unit cells with a quick turnaround time without a need for design intervention.

In embodiments, contact locations within whitespace areas are completely deterministic when there is no routing between design blocks. However, where there is routing between design blocks, a contact location between a last metal layer in a cell stack and the routing layer metal may be made somewhat deterministic. Also, in embodiments, cell stack up until the back-end routing layer may be identical to each other, improving consistency between different whitespace routing conditions.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a top-down view of a die that includes two design blocks with whitespace regions in between, in accordance with various embodiments. Partial wafer 100, which may be an example die footprint, shows an example of a first design block 106 and a second design block 108. The first design block 106 includes a first whitespace region 110 in the center of the first design block 106. The first whitespace region 110 does not include any metal routing at the upper layers electrically coupling the first design block 106 with itself. A second whitespace region 112 is located between the first design block 106 and the second design block 108. The second whitespace region 112 does include metal routing 113 at the upper layers that electrically couple the first design block 106 and the second design block 108. A third whitespace region 114 is located in the center of the second design block 108, and does include metal routing 115 at upper layers that electrically couple the second design block 108 with itself.

Partial wafer 100 may be split up into individual cells 102 that may have a width of 102a and a length of 102b. The dimension of the individual cells 102 may be chosen such that whitespace 110, 112, 114 may be split into uniform cells. As a result, cells within a whitespace may then be separated into different cell types, depending on their proximity to the design blocks 106, 108, as discussed further below. The whitespace 110, 112, 114, which may be initially empty regions, are to be filled to avoid density related manufacturing/fabrication process-related defects induced by dishing and erosion during Chemical Mechanical Polishing (CMP).

Figure 2:
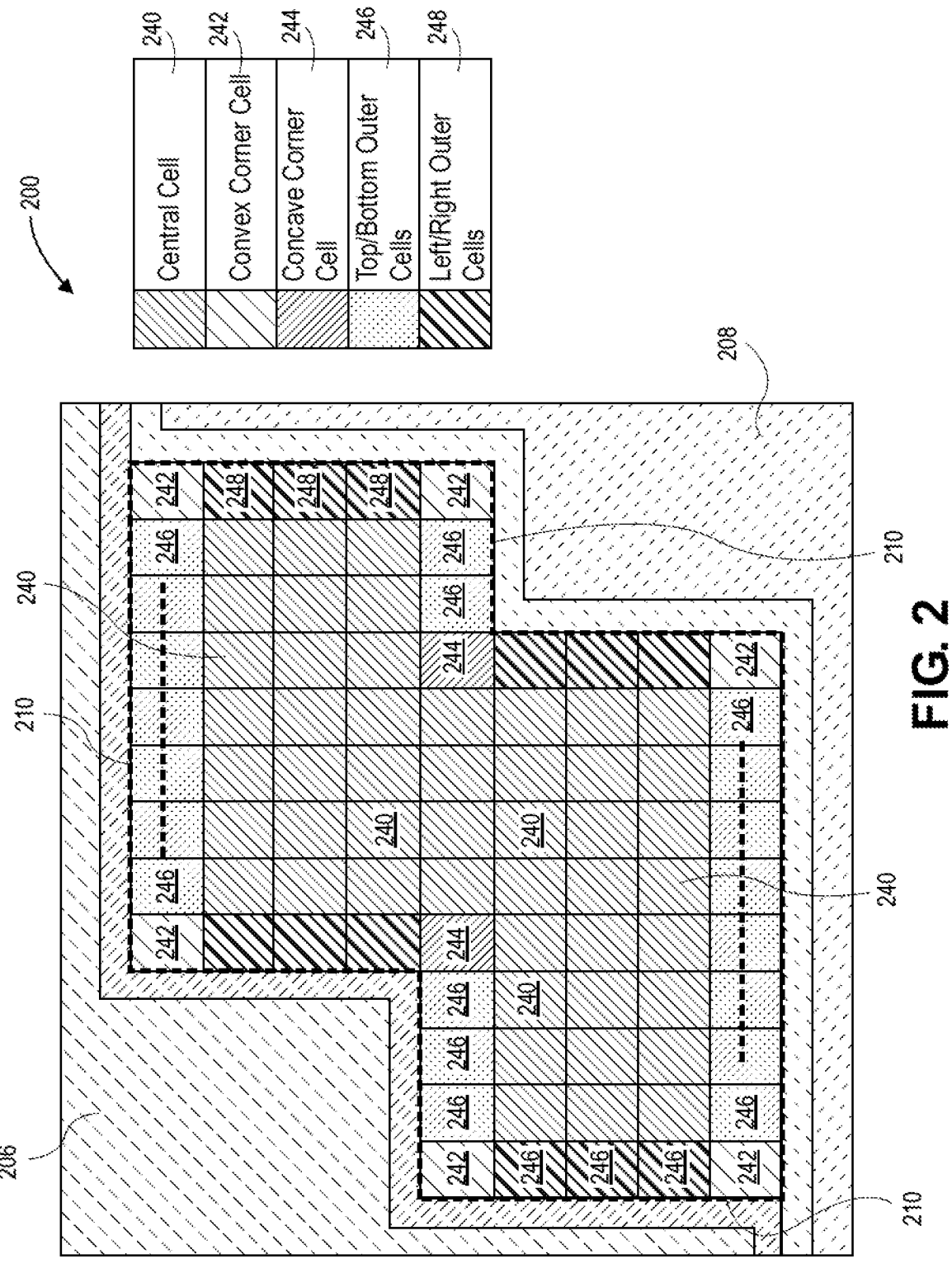
FIG. 2 illustrates a top-down view of a die that includes two design blocks with a whitespace region in between divided into cells, with periphery cells having a different design and functionality than central cells, in accordance with various embodiments.

FIG. 2 illustrates a top-down view of a die that includes two design blocks with a whitespace region in between divided into cells, with periphery cells having a different design and functionality than central cells, in accordance with various embodiments. Partial wafer 200, which may be similar to partial wafer 100 of FIG. 1, shows a first design block 206 and a second design block 208, which may be similar to first design block 106 and second design block 108 of FIG. 1. Whitespace 210, which may be similar whitespace 110 of FIG. 1, includes a plurality of cells 240, 242, 244, 246, 248 that make up a contiguous group of cells within the whitespace 210. In embodiments, the plurality of cells 240, 242, 244, 246, 248 may be have a similar footprint and/or dimension of cell 102 of FIG. 1.

In embodiments, the plurality of cells 240, 242, 244, 246, 248 within the white space 210 may be different cell types, depending upon the cells' proximity to the first design block 206 or a second design block 208. In embodiments, periphery cells 242, 244, 246, 248 include cells that are closest to the active circuitry in the first design block 206 or the second design block 208, and may be different periphery cell types. In embodiments, a periphery cell 242 may have a plurality of edges that are adjacent to a first design block 206 or a second design block 208. This type of periphery cell 242 may be referred to as a convex corner cell 242.

In embodiments, a periphery cell 244 may have a single corner that is adjacent to a first design block 206 or a second design block 208. In embodiments, a periphery cell 246 may have a top or a bottom of the cell that is adjacent to the first design block 206 or the second design block 208. This type of periphery cell 246 may be referred to as a top/bottom outer cell 246. In embodiments, a periphery cell 248 may have a left side or a right side of the cell that is adjacent to the first design block 206 or the second design block 208. This type of periphery cell 248 may be referred to as a left/right outer cell 248.

In embodiments, the design of the periphery cells 242, 244, 246, 248 may not have any electrical connections to the first design block 206 or the second design block 208, and may exist simply to provide a healthy transition between the first design block 206 or the second design block 208 and central cells 240. As a result, in embodiments, these periphery cells 242, 244, 246, 248 may not contain electrical contacts, active metal layers, or transistor components such as n-wells or p-wells.

In embodiments, central cells 240 are not adjacent to the first design block 206 or the second design block 208. In embodiments, the central cells 240 may include lower layers, as discussed further below with respect to FIG. 3, that may include front end (FE) layers that include metal routings, connections, n-wells or p-wells or other parts of dummy transistors, which are selected to meet metal density requirements of the fabrication process. In embodiments, each of the central cells 240 include a same design configuration.

Figure 3:
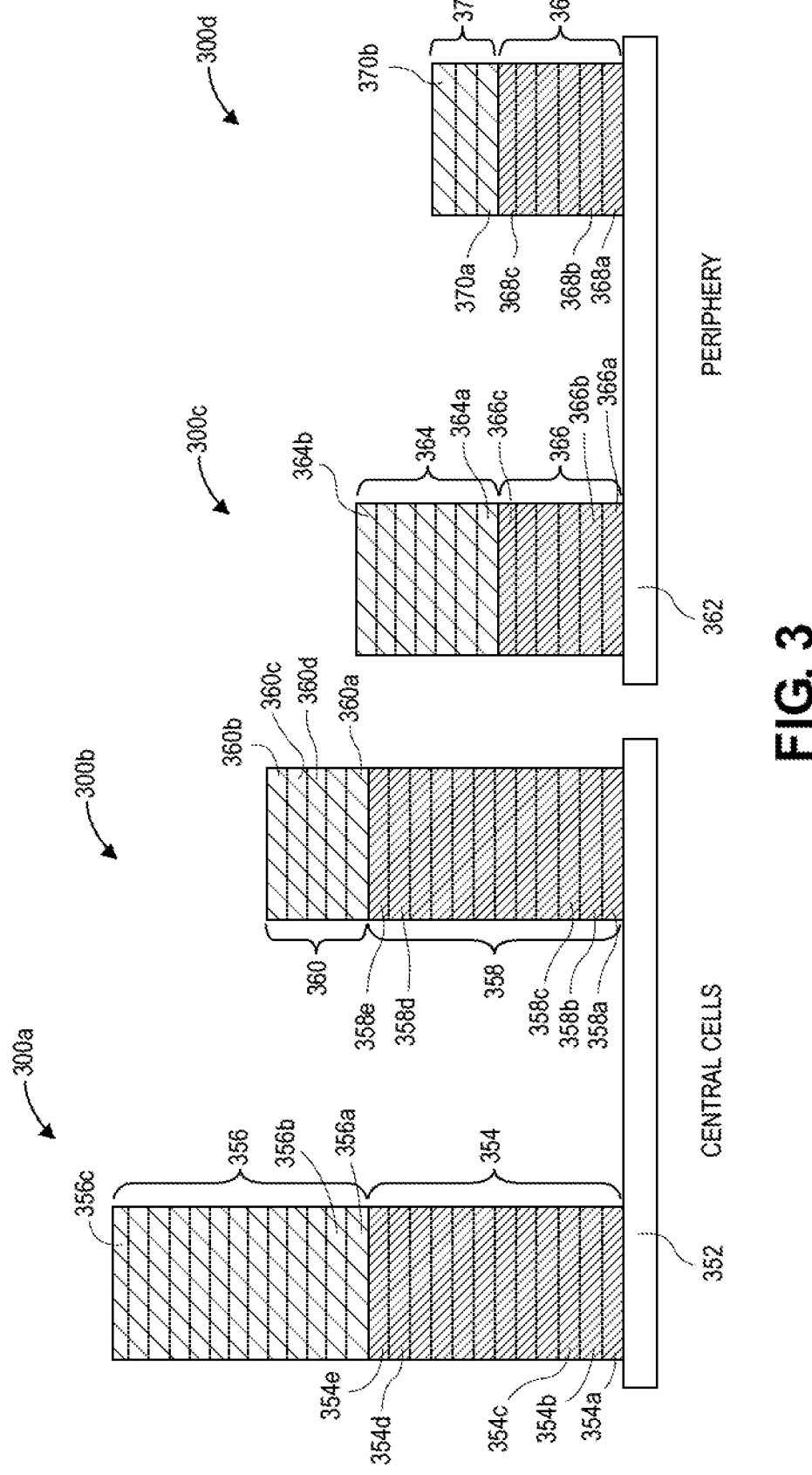
FIG. 3 illustrates cross section views of layers of cells within a whitespace region on a die, in accordance with various embodiments.

FIG. 3 illustrates cross section views of layers of cells within a whitespace region on a die, in accordance with various embodiments. Stacks 300a, 300b show embodiments of a visualization of fill stacks for central cells, such as central cells 240 of FIG. 2 that are on a wafer 352. Stack 300a shows an example where no routing exists between design blocks, for example between a first design block 206 and a second design block 208 of FIG. 2. FE layers 354 include a full stack, including well layers 354a, active layers 354b, and poly layers 354c all the way up through metal zero 354d and contact zero 354e layers. BE layers 356, on top of FE layers 354, include a full stack including metal 1 356a and contact 1 356b layers through the metal final layer 356c at the top.

Stack 300b shows an example where routing exists between design blocks at metal layer 4. FE layers 358 include a full stack, similar to FE layers 354, including well layers 358a, active layers 358b, and poly layers 358c all the way up through metal zero 358d and contact zero 358e layers. BE layers 360, on top of FE layers 356, include only a partial stack, from a metal layer 1 360a through metal layer 3 360b at the top. Stack 300b provides additional room for electrical routings at the metal 4 layer and above, as referred to above and as discussed in greater detail with respect to FIG. 4.

With respect to stack 300b, uppermost contact layer in BE 360 with routing is contact 2 360c, between metal 2 360d and metal 3 360b. In embodiments, when defining possible contact 3 locations on central cell metal 3 line, a same metal 3 line may be explicitly reserved at the location where central cell contact 3 would land if routing did not exist. This is discussed further with respect to FIG. 4. In embodiments, this technique may improve through-the-stack consistency of central cells between no routing of stack 300a and routing of stack 300b cases. In embodiments, potential candidate locations within each cell may be selected to meet contact layer patterning requirements and contact layer density requirements.

Stacks 300c, 300d show embodiments of a visualization of fill stacks for periphery cells, such as periphery cells 242, 244, 246, 248 of FIG. 2 that are on a wafer 362. Stack 300c shows an example where no routing exists between design blocks, for example between a first design block 206 and a second design block 208 of FIG. 2. FE layers 366 include a full stack, including active layers 366b and poly layers 366a all the way up through just below metal 1 layer 366c. BE layers 364, on top of FE layers 366, include a full stack, including metal 1 364a through the metal final layer 364b at the top.

Stack 300d shows an example where routing exists between design blocks at metal layer 4. FE layers 368 include a full stack, similar to FE layers 366, including active layers 368b and poly layers 368a all the way up through just below metal 1 layer 368c. BE layers 370, on top of FE layers 368, include only a partial stack, from a metal layer 1 370a through metal layer 3 370b at the top. Stack 300d provides additional room for electrical routings at the metal 4 layer and above, as referred to above and as discussed in greater detail with respect to FIG. 4.

Referring back to FIG. 2, in embodiments, the whitespace region 210 may not otherwise have any layers starting from the FE and up to a back-end (BE) metal layer if routing between the first design block 206 and the second design block 208 is enabled. If such routing is not enabled, the whitespace region 210 may be left empty by design up to passivation/bump layers. In addition, if routing is enabled on a BE metal layer, for example metal $M_N$, then the entire whitespace region 210 with the routing may be filled by cells designed for $M_{N-1}$. For example, N is 4, then the routing layer is MT4 and no drawn layer up until MT4 should exist in that whitespace region 210. Both the periphery cells 242, 244, 246, 248 and central cells 240 of the whitespace region 210 should include all FE layers and metal layers 1, 2, and 3. For example, periphery cells 242, 244, 246, 248 may not contain any contact layers, but central cells 240 may have FE and BE contacts up until contact 2. Contact 3 may be synthesized independently in a non-cell-based fashion between central cells 240 dummy metal 3 and dummy routing layer metal 4.

Figure 4:
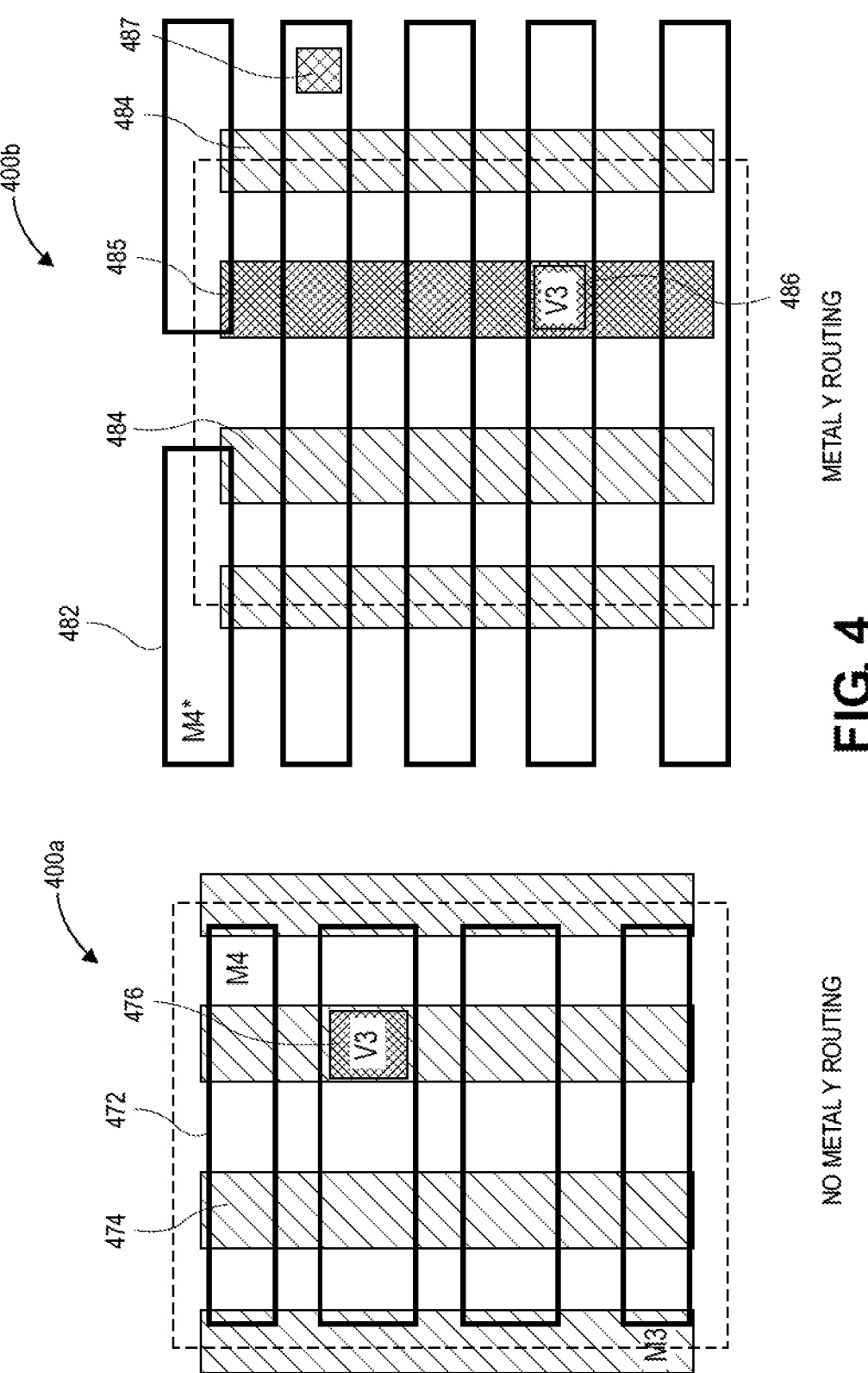
FIG. 4 illustrates top-down views of "metal 3-contact 3-metal 4" stack for both no metal 4 routing and with metal 4 routing over a whitespace region on a wafer, in accordance with various embodiments.

FIG. 4 illustrates top-down views of metal routings within layers of cells within a whitespace region on a wafer, in accordance with various embodiments. Diagram 400a shows a top-down view of center cell, which may be similar to center cell 240 of FIG. 2, in an embodiment where there is no routing layer at metal 4 between a first design block and a second design block, such as first design block 206 or second design block 208 of FIG. 2. Diagram 400a shows a metal 4 layer 472 that is on top of a metal 3 layer 474, where a via metal contact 476 is placed to electrically couple metal 4 layer 472 with metal 3 layer 474, and to affect a metal density of the center cell 400a. Here, because there is no routing layer, there may be no restrictions on the location of where the via metal contact 476 is placed.

Diagram 400b shows a top-down view of center cell, which may be similar to center cell 240 of FIG. 2, in an embodiment where there is a routing layer at metal 4 between a first design block and a second design block, such as first design block 206 or second design block 208 of FIG. 2. Diagram 400b shows a metal 4 layer 482 that includes routing, and a metal 3 layer 484 underneath. A routing via metal contact 487 may be used by the routing layer and may be part of the electrical circuit connecting the first design block and the second design block. Here, because there is a routing layer, there are restrictions on the location of where a fill via metal contact 486 may be placed, in particular via metal contact 486 may only be placed at the intersection of drawn metal 4 layer 482 that is not an active routing line (i.e. does not have drawn contact layer 487) and fill metal three layer 485.

Figure 5:
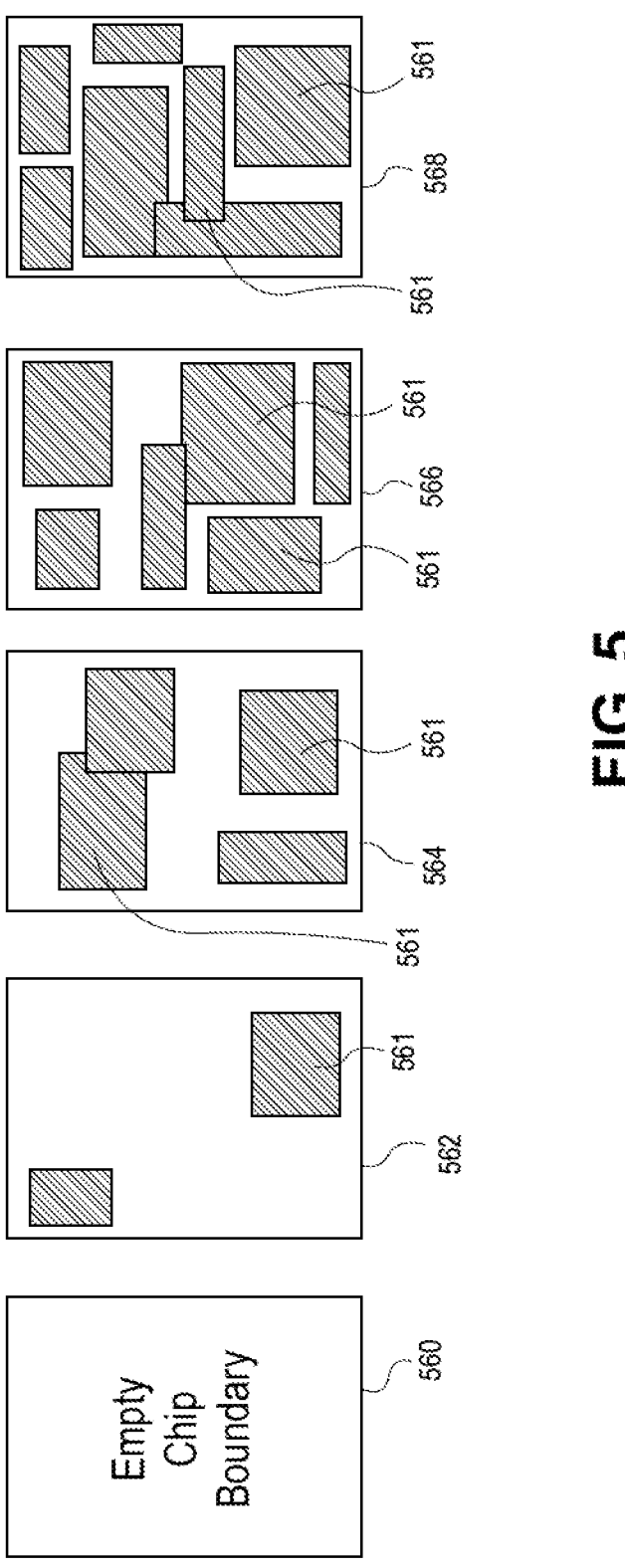
FIG. 5 illustrates top-down views of example filler cells of varying densities within a chip boundary on a wafer, in accordance with various embodiments.

FIG. 5 illustrates top-down views of example filler cells of varying densities within a chip boundary on a wafer, in accordance with various embodiments. Chip 560 is an example of an empty chip boundary, which may be similar to partial wafer 100 of FIG. 1. Chip 562, which may be similar to chip 560, includes a plurality of active design block cells 561 that are placed within the chip 562. Chip 562 shows an approximate 20% density. Chip 564, which may be similar to chip 560, includes a plurality of active design block cells 561 that are placed within the chip 564. Chip 564 shows an approximate 40% density. Chip 566, which may be similar to chip 560, includes a plurality of active design block cells 561 that are placed within the chip 566. Chip 566 shows an approximate 60% density. Chip 568, which may be similar to chip 560, includes a plurality of active design block cells 561 that are placed within the chip 568. Chip 568 shows an approximate 80% density.

In embodiments, once active design block cells 561 have been placed, techniques described above with respect to FIGS. 1-4 may be used to place center cells and periphery cells (not shown) which may be similar to center cells 240 and periphery cells 242, 244, 246, 248 of FIG. 2 within the whitespace that is not taken by active design block cells 561.

Figure 6A:
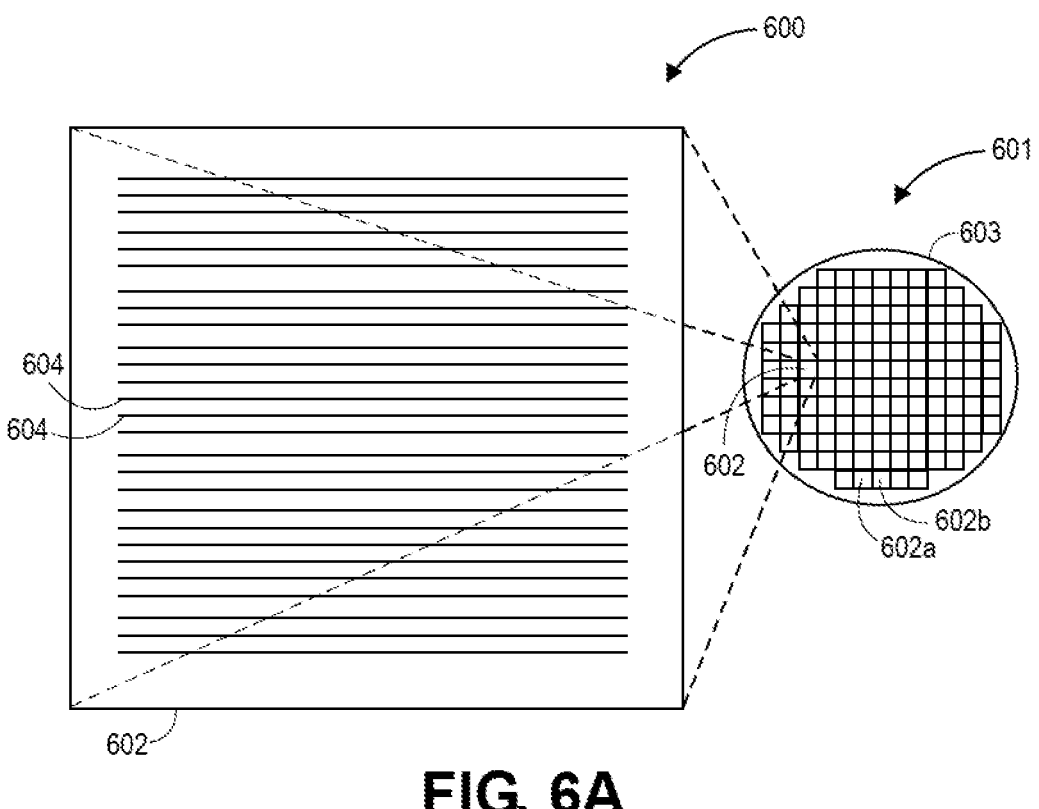
FIGS. 6A-6B schematically illustrate a top view of an example die in wafer form and in singulated form, and a cross section side view of a package assembly, in accordance with various embodiments.
Figure 6B:
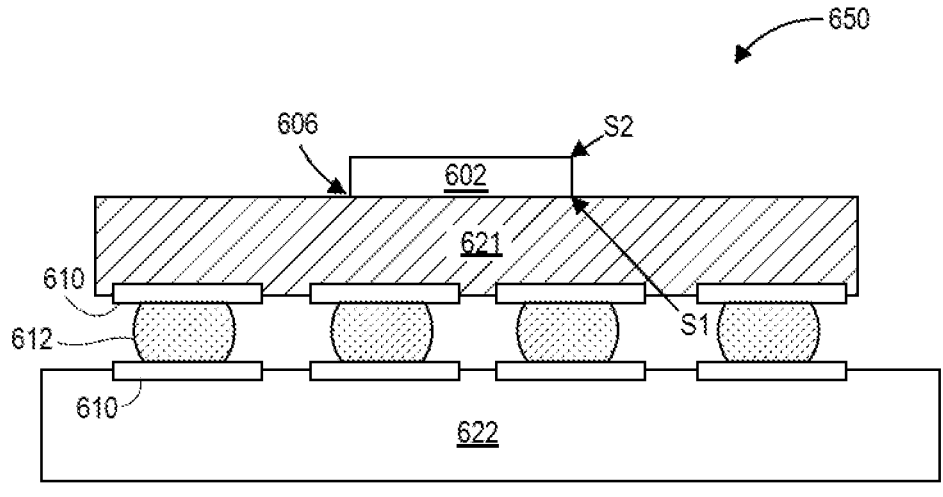

FIGS. 6A-6B schematically illustrate a top view of an example die in wafer form and in singulated form, and a cross section side view of a package assembly, in accordance with various embodiments. FIGS. 6A-6B schematically illustrate a top view of an example die in wafer form and in singulated form, and a cross section side view of a package assembly, in accordance with various embodiments. FIG. 6A schematically illustrates a top view of an example die 602 in a wafer form 601 and in a singulated form 600, in accordance with some embodiments. In some embodiments, die 602 may be one of a plurality of dies, e.g., dies 602, 602a, 602b, of a wafer 603 comprising semiconductor material, e.g., silicon or other suitable material. The plurality of dies, e.g., dies 602, 602a, 602b, may be formed on a surface of wafer 603. Each of the dies 602, 602a, 602b, may be a repeating unit of a semiconductor product that includes devices as described herein. For example, die 602 may include circuitry having elements such as capacitors and/or inductors 604 (e.g., fin structures, nanowires, and the like) that provide a channel pathway for mobile charge carriers in transistor devices. Although one or more capacitors and/or inductors 604 are depicted in rows that traverse a substantial portion of die 602, it is to be understood that one or more capacitors and/or inductors 604 may be configured in any of a wide variety of other suitable arrangements on die 602 in other embodiments.

After a fabrication process of the device embodied in the dies is complete, wafer 603 may undergo a singulation process in which each of dies, e.g., die 602, is separated from one another to provide discrete "chips" of the semiconductor product. Wafer 603 may be any of a variety of sizes. In some embodiments, wafer 603 has a diameter ranging from about 25.4 mm to about 450 mm. Wafer 603 may include other sizes and/or other shapes in other embodiments. According to various embodiments, the one or more capacitors and/or inductors 604 may be disposed on a semiconductor substrate in wafer form 601 or singulated form 600. One or more capacitors and/or inductors 604 described herein may be incorporated in die 602 for logic, memory, or combinations thereof. In some embodiments, one or more capacitors and/or inductors 604 may be part of a system-on-chip (SoC) assembly.

FIG. 6B schematically illustrates a cross-section side view of an integrated circuit (IC) assembly 650, in accordance with some embodiments. In some embodiments, IC assembly 650 may include one or more dies, e.g., die 602, electrically or physically coupled with a package substrate 621. Die 602 may include one or more capacitors and/or inductors 604 as described herein. In some embodiments, package substrate 621 may be electrically coupled with a circuit board 622 as is well known to a person of ordinary skill in the art. Die 602 may represent a discrete product made from a semiconductor material (e.g., silicon) using semiconductor fabrication techniques such as thin film deposition, lithography, etching, and the like. In some embodiments, die 602 may be, include, or be a part of a processor, memory, SoC or ASIC in some embodiments.

Die 602 can be attached to package substrate 621 according to a wide variety of suitable configurations including, for example, being directly coupled with package substrate 621 in a flip-chip configuration, as depicted. In the flip-chip configuration, an active side S1 of die 602 including circuitry is attached to a surface of package substrate 621 using hybrid bonding structures as described herein that may also electrically couple die 602 with package substrate 621. Active side S1 of die 602 may include multi-threshold voltage transistor devices as described herein. An inactive side S2 of die 602 may be disposed opposite to active side S1.

In some embodiments, package substrate 621 is an epoxy-based laminate substrate having a core and/or build-up layers such as, for example, an Ajinomoto Build-up Film (ABF) substrate. Package substrate 621 may include other suitable types of substrates in other embodiments including, for example, substrates formed from glass, ceramic, or semiconductor materials.

Package substrate 621 may include electrical routing features configured to route electrical signals to or from die 602. The electrical routing features may include pads or traces (not shown) disposed on one or more surfaces of package substrate 621 and/or internal routing features (not shown) such as trenches, vias, or other interconnect structures to route electrical signals through package substrate 621. In some embodiments, package substrate 621 may include electrical routing features such as pads (not shown) configured to receive the respective die-level interconnect structures 606 of die 602.

Circuit board 622 may be a printed circuit board (PCB) comprising an electrically insulative material such as an epoxy laminate. Circuit board 622 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 602 through circuit board 622. Circuit board 622 may comprise other suitable materials in other embodiments. In some embodiments, circuit board 622 is a motherboard as is well known to a person of ordinary skill in the art.

Package-level interconnects such as, for example, solder balls 612 may be coupled to one or more pads 610 on package substrate 621 and/or on circuit board 622 to form corresponding solder joints that are configured to further route the electrical signals between package substrate 621 and circuit board 622. Pads 610 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 621 with circuit board 622 may be used in other embodiments.

IC assembly 650 may include a wide variety of other suitable configurations in other embodiments including, for example, suitable combinations of flip-chip and/or wire-bonding configurations, interposers, multi-chip package configurations including system-in-package (SiP), and/or package-on-package (POP) configurations. Other suitable techniques to route electrical signals between die 602 and other components of IC assembly 650 may be used in some embodiments.

A person of ordinary skill in the art should recognize that any known semiconductor device fabricated using any known semiconductor process that may benefit from the principles described herein.

FIG. 7 illustrates an example process for manufacturing a wafer that includes transition cells between design blocks on the wafer, in accordance with various embodiments. Process 700 may be implemented using the techniques and/or embodiments described herein, and in particular with respect to FIGS. 1-7B.

At block 702, the process may include providing a wafer.

At block 704, the process may further include placing a first design block on a first area of the wafer.

At block 706, the process may further include placing a second design block on a second area of the wafer, wherein the first area of the wafer is different than the second area of the wafer.

At block 708, the process may further include forming a transition block on a third area of the wafer, wherein the third area is at least partially between the first area and the second area, wherein the transition block includes a plurality of cells, wherein each of the cells are contiguous, and wherein a density of metal of a first cell that is adjacent to the first area or the second area has a different metal density than a second cell that is not adjacent to the first area and not adjacent to the second area.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
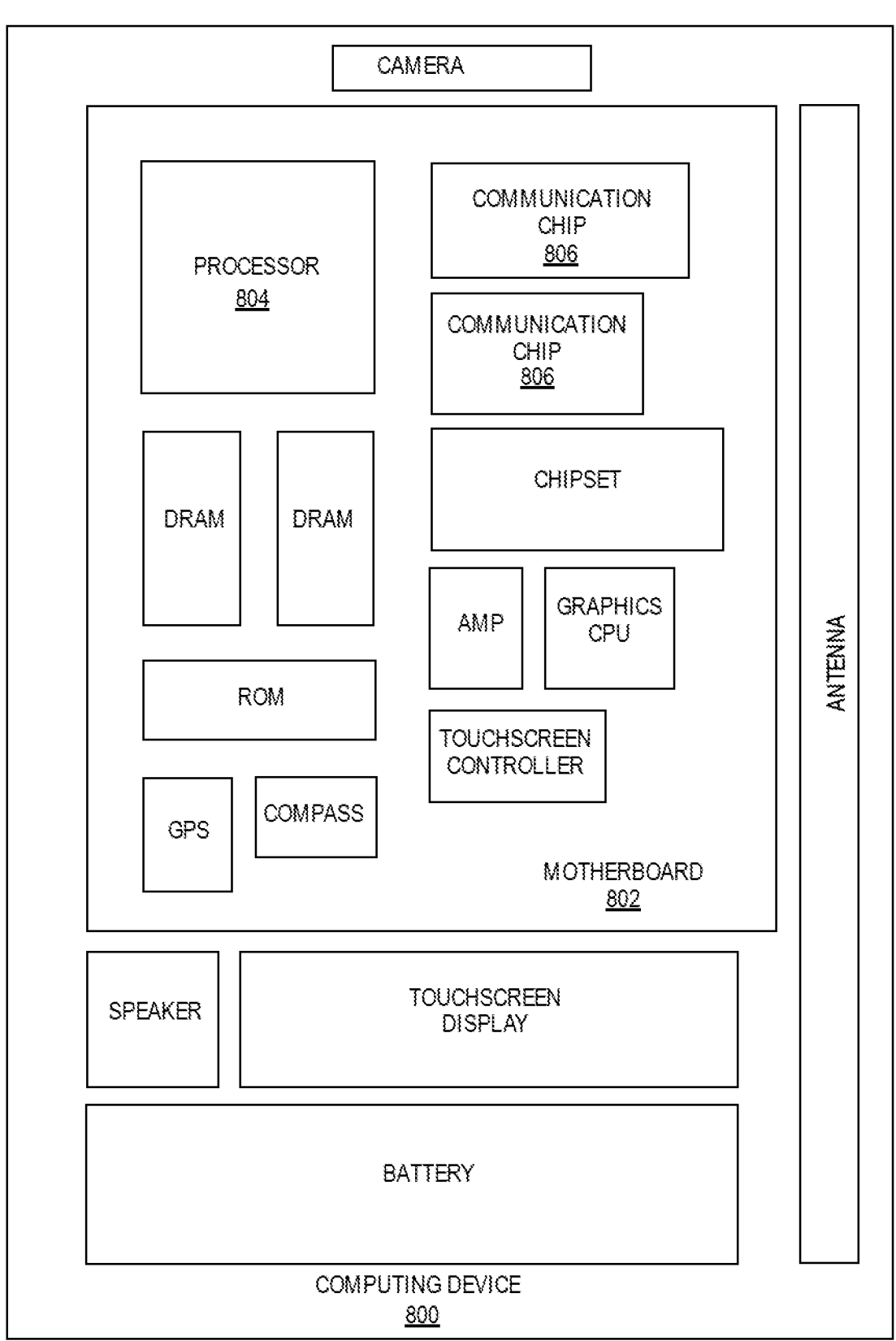
FIG. 8 illustrates a computing device in accordance with one implementation of the invention.

FIG. 8 illustrates a computing device in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
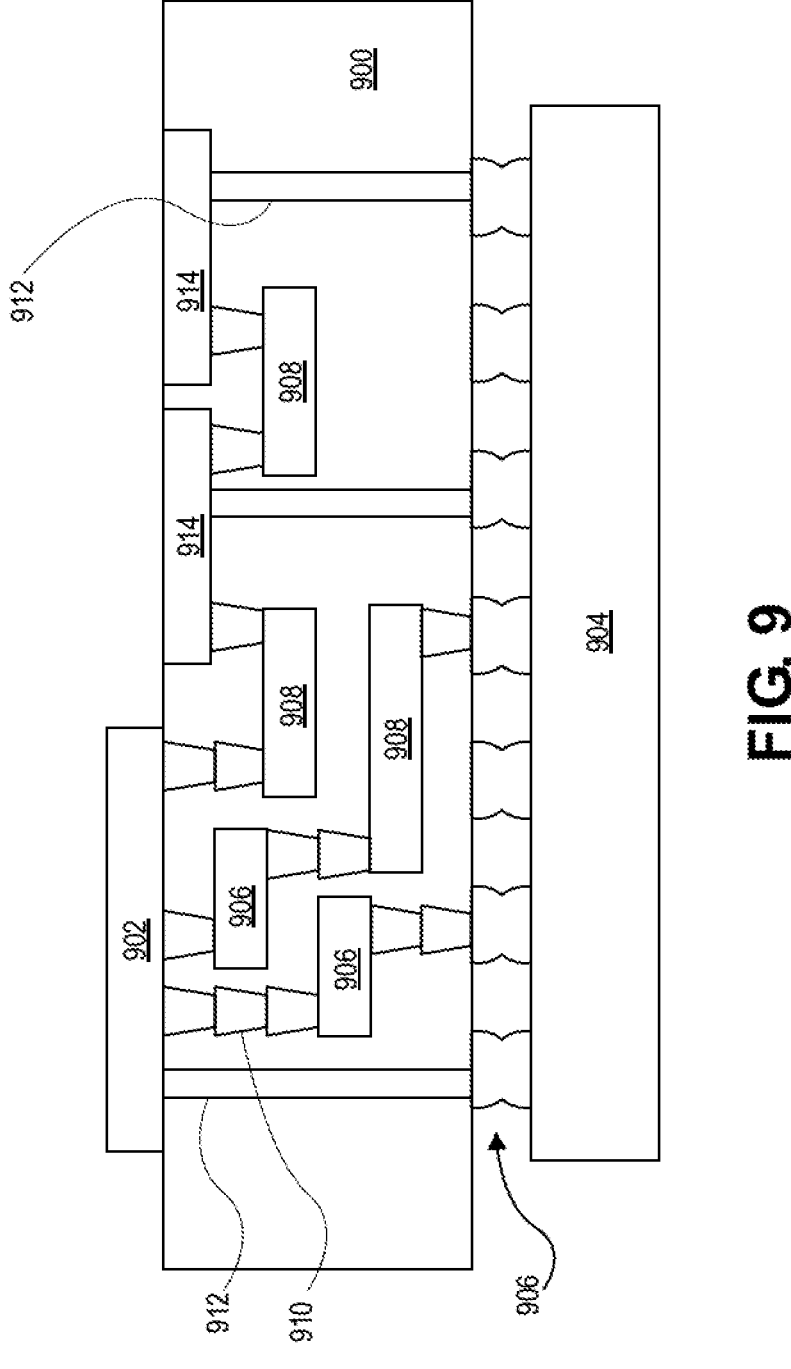
FIG. 9 illustrates an interposer that includes one or more embodiments of the invention.

FIG. 9 illustrates an interposer that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a wafer; a design block on a first area of the wafer, wherein the design block includes a plurality of layers, and wherein the design block includes metal circuitry; a transition block on a second area of the wafer tangent to the first area, wherein the transition block includes plurality of cells, wherein each of the cells are contiguous, and wherein each of the cells has a plurality of layers; and wherein a density of metal of a first cell that is adjacent to the design block is different than a density of metal of a second cell that is not adjacent to the design block.

Example 2 includes the apparatus of example 1, or of any other example or embodiment herein, wherein a number of layers in the first cell is different than a number of layers in the second cell.

Example 3 includes the apparatus of example 1, or of any other example or embodiment herein, wherein the second cell is a plurality of second cells, and wherein a design pattern of each of the plurality of second cells is substantially similar.

Example 4 includes the apparatus of example 1, or of any other example or embodiment herein, wherein the plurality of cells include a selected one or more of: a metal contact, a metal routing, or a transistor structure.

Example 5 includes the apparatus of example 1, or of any other example or embodiment herein, wherein the first cell is a plurality of first cells, and wherein one of the plurality of first cells has a different density of metal than another of the plurality of first cells.

Example 6 includes the apparatus of example 5, or of any other example or embodiment herein, wherein an area of a perimeter of the one of the plurality of first cells that is tangent to the design block of the first area is different than an area of a perimeter of the other of the plurality of first cells that is tangent to the design block.

Example 7 includes the apparatus of example 1, or of any other example or embodiment herein, wherein the transition block extends from an edge of the design block to an edge of the wafer.

Example 8 includes the apparatus of example 1, or of any other example or embodiment herein, wherein the design block is a first design block; and further comprising: a second design block on a third area of the wafer different from the first area of the wafer, wherein the second design block includes a plurality of layers, and wherein the second design block includes metal circuitry; wherein the first cell is adjacent to the first design block or adjacent to the second design block; and wherein the second cell is not adjacent to the first design block and not adjacent to the second design block.

Example 9 includes the apparatus of example 8, or of any other example or embodiment herein, wherein the plurality layers of the plurality of cells include upper layers and lower layers; and wherein the upper layers of at least a portion of the plurality of cells include electrical routing features that electrically couple the first design block with the second design block.

Example 10 includes the apparatus of example 9, or of any other example or embodiment herein, wherein the lower layers of the plurality of cells are electrically isolated from the upper layers of the plurality of cells.

Example 11 includes the apparatus of example 9, or of any other example or embodiment herein, wherein the lower layers of the plurality cells are electrically isolated from the first design block and the second design block.

Example 12 includes the apparatus of example 8, or of any other example or embodiment herein, wherein the first cell does not include a metal contact or active well layers.

Example 13 includes the apparatus of example 1, or of any other example or embodiment herein, wherein the plurality of cells have a rectangular shape.

Example 14 is a method comprising: providing a wafer; placing a first design block on a first area of the wafer; placing a second design block on a second area of the wafer, wherein the first area of the wafer is different than the second area of the wafer; and forming a transition block on a third area of the wafer, wherein the third area is at least partially between the first area and the second area, wherein the transition block includes a plurality of cells, wherein each of the cells are contiguous, and wherein a density of metal of a first cell that is adjacent to the first area or the second area has a different metal density than a second cell that is not adjacent to the first area and not adjacent to the second area.

Example 15 includes the method of example 14, or of any other example or embodiment herein, wherein a design of each of a plurality of second cells is substantially similar.

Example 16 includes the method of example 14, or of any other example or embodiment herein, wherein forming a transition block on the third area of the wafer further includes: forming lower layers of the transition block; and forming upper layers of the transition block.

Example 17 includes the method of example 16, or of any other example or embodiment herein, wherein forming lower layers of the transition block further includes forming lower layers of a plurality of second cells that include a selected one or more of: a metal contact, a metal routing, or a transistor structure.

Example 18 includes the method of example 16, or of any other example or embodiment herein, wherein forming upper layers of the transition block further includes forming routing layers in the upper layers of the transition blocks that electrically couple the first design block at the second design block.

Example 19 is a package comprising: an interposer; and a wafer coupled with the interposer, the wafer comprising: a design block on a first area of the wafer, wherein the design block includes a plurality of layers, and wherein the design block includes metal circuitry; a transition block on a second area of the wafer tangent to the first area, wherein the transition block includes a plurality of cells, wherein each of the cells are contiguous, and wherein each of the cells has a plurality of layers; and wherein a density of metal of a first cell that is adjacent to the design block is different than a density of metal of a second cell that is not adjacent to the design block.

Example 20 includes the package of example 19, or of any other example or embodiment herein, wherein the design block is a first design block; and further comprising: a second design block on a third area of the wafer different from the first area of the wafer, wherein the second design block includes a plurality of layers, and wherein the second design block includes metal circuitry; wherein the first cell is adjacent to the first design block or adjacent to the second design block; and wherein the second cell is not adjacent to the first design block and not adjacent to the second design block.

Example 21 is a die comprising: a substrate; a design block on a first area of the substrate, wherein the design block includes a plurality of layers, and wherein the design block includes metal circuitry; a transition block on a second area of the substrate tangent to the first area, wherein the transition block includes a plurality of cells, wherein each of the cells are contiguous, and wherein each of the cells has a plurality of layers; and wherein a density of metal of a first cell that is adjacent to the design block is different than a density of metal of a second cell that is not adjacent to the design block.

Example 22 may include the die of example 21, or of any other example or embodiment herein, wherein a number of layers in the first cell is different than a number of layers in the second cell.

Example 23 may include the die of example 21, or of any other example or embodiment herein, wherein the second cell is a plurality of second cells, and wherein a design pattern of each of the plurality of second cells is substantially similar.

Example 24 may include the die of example 21, or of any other example or embodiment herein, wherein the plurality of cells include a selected one or more of: a metal contact, a metal routing, or a transistor structure.

Example 25 may include the die of example 21, or of any other example or embodiment herein, wherein the first cell is a plurality of first cells, and wherein one of the plurality of first cells has a different density of metal than another of the plurality of first cells.

Example 26 may include the die of example 25, or of any other example or embodiment herein, wherein an area of a perimeter of the one of the plurality of first cells that is tangent to the design block of the first area is different than an area of a perimeter of the other of the plurality of first cells that is tangent to the design block.

Example 27 may include the die of example 21, or of any other example or embodiment herein, wherein the transition block extends from an edge of the design block to an edge of the die.

Example 28 may include the die of example 21, or of any other example or embodiment herein, wherein the design block is a first design block; and further comprising: a second design block on a third area of the substrate different from the first area of the substrate, wherein the second design block includes a plurality of layers, and wherein the second design block includes metal circuitry; wherein the first cell is adjacent to the first design block or adjacent to the second design block; and wherein the second cell is not adjacent to the first design block and not adjacent to the second design block.

Example 29 may include the die of example 28, or of any other example or embodiment herein, wherein the plurality layers of the plurality of cells include upper layers and lower layers; and wherein the upper layers of at least a portion of the plurality of cells include electrical routing features that electrically couple the first design block with the second design block.

Example 30 may include the die of example 29, or of any other example or embodiment herein, wherein the lower layers of the plurality of cells are electrically isolated from the upper layers of the plurality of cells.

Example 31 may include the die of example 29, or of any other example or embodiment herein, wherein the lower layers of the plurality cells are electrically isolated from the first design block and the second design block.

Example 32 may include the die of example 28, or of any other example or embodiment herein, wherein the first cell does not include a metal contact or active well layers.

Example 33 may include the die of example 21, or of any other example or embodiment herein, wherein the plurality of cells have a rectangular shape.

What is claimed is:

1. An apparatus comprising:
   a wafer;
   a design block on a first area of the wafer, wherein the design block includes a plurality of layers, and wherein the design block includes metal circuitry;
   a transition block on a second area of the wafer tangent to the first area, wherein the transition block includes a plurality of cells, wherein each of the cells are contiguous, and wherein each of the cells has a plurality of layers; and wherein a density of metal of a first cell that is adjacent to the design block is different than a density of metal of a second cell that is not adjacent to the design block, wherein the design block comprises a first design block; and further comprising:

a second design block on a third area of the wafer different from the first area of the wafer, wherein the second design block includes a plurality of layers, and wherein the second design block includes metal circuitry;

wherein the first cell is adjacent to the first design block or adjacent to the second design block; and wherein the second cell is not adjacent to the first design block and not adjacent to the second design block, wherein the plurality layers of the plurality of cells of the transition layer include upper layers and lower layers; and wherein the upper layers of at least a portion of the plurality of cells include electrical routing features that electrically couple the first design block with the second design block.

2. The apparatus of claim 1, wherein a number of layers in the first cell is different than a number of layers in the second cell.

3. The apparatus of claim 1, wherein the second cell is a plurality of second cells, and wherein a design pattern of each of the plurality of second cells is the same.

4. The apparatus of claim 1, wherein the plurality of cells of the transition block include a selected one or more of: a metal contact, a metal routing, or a transistor structure.

5. The apparatus of claim 1, wherein the first cell is a plurality of first cells, and wherein one of the plurality of first cells has a different density of metal than another of the plurality of first cells.

6. The apparatus of claim 5, wherein an area of a perimeter of the one of the plurality of first cells that is tangent to the design block of the first area is different than an area of a perimeter of the other of the plurality of first cells that is tangent to the design block.

7. The apparatus of claim 1, wherein the transition block extends from an edge of the design block to an edge of the wafer.

8. The apparatus of claim 1, wherein the lower layers of the plurality of cells of the transition block are electrically isolated from the upper layers of the plurality of cells.

9. The apparatus of claim 1, wherein the lower layers of the plurality cells are electrically isolated from the first design block and the second design block.

10. The apparatus of claim 1, wherein the first cell does not include a metal contact or active well layers.

11. The apparatus of claim 1, wherein the plurality of cells of the transition block have a rectangular shape.

12. A package comprising:

an interposer; and a wafer coupled with the interposer, the wafer comprising:

a design block on a first area of the wafer, wherein the design block includes a plurality of layers, and wherein the design block includes metal circuitry;

a transition block on a second area of the wafer tangent to the first area, wherein the transition block includes a plurality of cells, wherein each of the cells are contiguous, and wherein each of the cells has a plurality of layers; and wherein a density of metal of a first cell that is adjacent to the design block is different than a density of metal of a second cell that is not adjacent to the design block, wherein the design block comprises a first design block; and further comprising:

a second design block on a third area of the wafer different from the first area of the wafer, wherein the second design block includes a plurality of layers, and wherein the second design block includes metal circuitry;

wherein the first cell is adjacent to the first design block or adjacent to the second design block; and wherein the second cell is not adjacent to the first design block and not adjacent to the second design block, wherein the plurality layers of the plurality of cells of the transition layer include upper layers and lower layers; and wherein the upper layers of at least a portion of the plurality of cells include electrical routing features that electrically couple the first design block with the second design block.

* * * * *